(12) United States Patent
Ohta et al.

(10) Patent No.: US 7,525,133 B2
(45) Date of Patent: Apr. 28, 2009

(54) TRENCH-GATE MOS TRANSISTOR COMPOSED OF MULTIPLE CONDUCTORS

(75) Inventors: Tsuyoshi Ohta, Yokohama (JP); Bungo Tanaka, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/616,603

(22) Filed: Dec. 27, 2006

(65) Prior Publication Data

US 2007/0145416 A1    Jun. 28, 2007

(30) Foreign Application Priority Data

Dec. 28, 2005   (JP)   ............................. 2005-377841

(51) Int. Cl.
*H01L 29/76* (2006.01)
(52) U.S. Cl. ..................................... 257/213
(58) Field of Classification Search ................. 257/564, 257/330, 332, E21.384, E29.131; 438/695, 438/259, 268, 621
See application file for complete search history.

(56) References Cited

U.S. PATENT DOCUMENTS 5,321,289 A * 6/1994 Baba et al. .................. 257/331
6,521,538 B2   2/2003 Soga et al.
2002/0140026 A1* 10/2002 Ishikawa et al. ............. 257/330
2004/0080001 A1*  4/2004 Takeuchi .................... 257/407
2007/0004134 A1*  1/2007 Vora .......................... 438/257

FOREIGN PATENT DOCUMENTS

| JP | 2001-244325 | 9/2001 |
| JP | 2001-284587 | 10/2001 |

* cited by examiner

*Primary Examiner*—W. David Coleman
*Assistant Examiner*—Walter H Swanson
(74) *Attorney, Agent, or Firm*—Oblon, Spivak, McClelland, Maier & Neustadt, P.C.

(57) ABSTRACT

A semiconductor device comprises on a surface of a first semiconductor layer of the first conduction type a second semiconductor layer of the first conduction type. A semiconductor base layer of the second conduction type is formed on the second semiconductor layer, and a semiconductor diffusion layer of the first conduction type is formed on a surface of the semiconductor base layer. A trench is formed from the surface of the semiconductor diffusion layer to a depth reaching the second semiconductor layer. A gate electrode is formed of a conductor film buried in the trench with a gate insulator interposed therebetween. The conductor film includes a first conductor film formed along the gate electrode to have a recess and a second conductor film formed to fill the recess.

12 Claims, 6 Drawing Sheets

TRENCH-GATE MOS TRANSISTOR COMPOSED OF MULTIPLE CONDUCTORS

CROSS REFERENCE TO RELATED APPLICATION

This application is based on and claims the benefit of priority from prior Japanese Patent Application No. 2005-377841, filed on Dec. 28, 2005, the entire contents of which are incorporated herein by reference.

BACKGROUND OF THE INVENTION

1. Field of the Invention

The present invention relates to a semiconductor device, and more particularly to a trench-gate semiconductor device.

2. Description of the Related Art

Known power semiconductor elements capable of achieving a low on resistance include a trench-gate MOS transistor and an insulated-gate bipolar transistor (IGBT).

A trench-gate, n-channel MOS transistor, for example, includes trenches formed in stripes or mesh such that they extend from an n-type source layer through a p-type base layer located below the source layer. A film of conductor such as polysilicon is buried with a gate insulator on a trench wall to form a gate electrode. Such the structure produces a power semiconductor element with a lower on resistance than that of the so-called planar gate type that includes a gate electrode formed on a gate insulator formed over a surface of the base layer.

In such the trench-gate structure, electric field concentration may easily arise at a corner of the bottom of the trench and this may cause deterioration of the breakdown voltage as a problem. When the trench width is reduced as fine patterning proceeds, the radius of curvature at the trench corner further decreases, and the degree of electric field concentration increases at the trench corner of the trench bottom. If the radius of curvature at the trench corner is small, current flows in a drift layer not uniformly, thereby increasing the drift resistance, resulting in increases in on resistance and power consumption in the element as a problem. Therefore, an anisotropic etching is applied to the trench bottom to round the trench bottom to form an almost reverse-tapered (flask-shaped) trench having an enlarged radius of curvature (see JP2001/244325A, paragraphs 0019-0022, FIG. 1 and so forth). This shape relieves the electric field at the trench bottom to improve the breakdown voltage and enables the drift layer to be thinned to the extent to reduce the drift resistance and thus reduce the on resistance.

When such the reverse-tapered trench is formed, a void may easily arise in the conductor film, or polysilicon film, configuring the gate electrode. The void causes no problem so long as it exists in the polysilicon film at the center. Rather, it reduces stresses due to fine pattering and contributes to prevention of occurrences of D-S leakage current. During crystallization of polysilicon proceeding in a heat treatment step executed after the formation of polysilicon, however, the void may migrate and come into contact with the gate insulator possibly. In this case, in the p-type base layer opposite to the void brought into contact with the gate insulator, an inverted layer is hardly formed even though the gate voltage is applied. In addition, in the drift layer below the base layer, an accumulation layer is hardly formed. Accordingly, this causes an increase in on resistance as a problem. The void easily occurs in the reverse-tapered trench though the same problem arises if a void occurs regardless of the trench shape.

Such the migration of the void may cause the following two problems associated with the reliability of the gate electrode. One is a problem found in a gate ruggedness test because an electric field concentrates on the gate insulator at a void edge (a boundary between the void and the polysilicon). Accordingly, the breakdown ruggedness lowers and reduces TDDB and ESD ruggedness. Another is a problem related to the above electric field concentration that facilitates charges to flow through the gate insulator. This causes a threshold voltage fluctuation due to a charge trap in the insulator in a high-temperature gate bias test.

SUMMARY OF THE INVENTION

In an aspect the present invention provides a semiconductor device, which comprises a first semiconductor layer of the first conduction type; a second semiconductor layer of the first conduction type formed on a surface of the first semiconductor layer; a semiconductor base layer of the second conduction type formed on the second semiconductor layer; a semiconductor diffusion layer of the first conduction type formed on a surface of the semiconductor base layer; a trench formed from the surface of the semiconductor diffusion layer to a depth reaching the second semiconductor layer; a gate electrode formed of a conductor film buried in the trench with a gate insulator interposed therebetween; a first main electrode brought into contact with the semiconductor diffusion layer and the semiconductor base layer; and a second main electrode formed on the rear surface of the first semiconductor layer, wherein the conductor film includes a first conductor film formed along the gate electrode to have a recess inside the trench and a second conductor film formed to fill the recess.

DETAILED DESCRIPTION OF THE EMBODIMENTS

Figure 1:
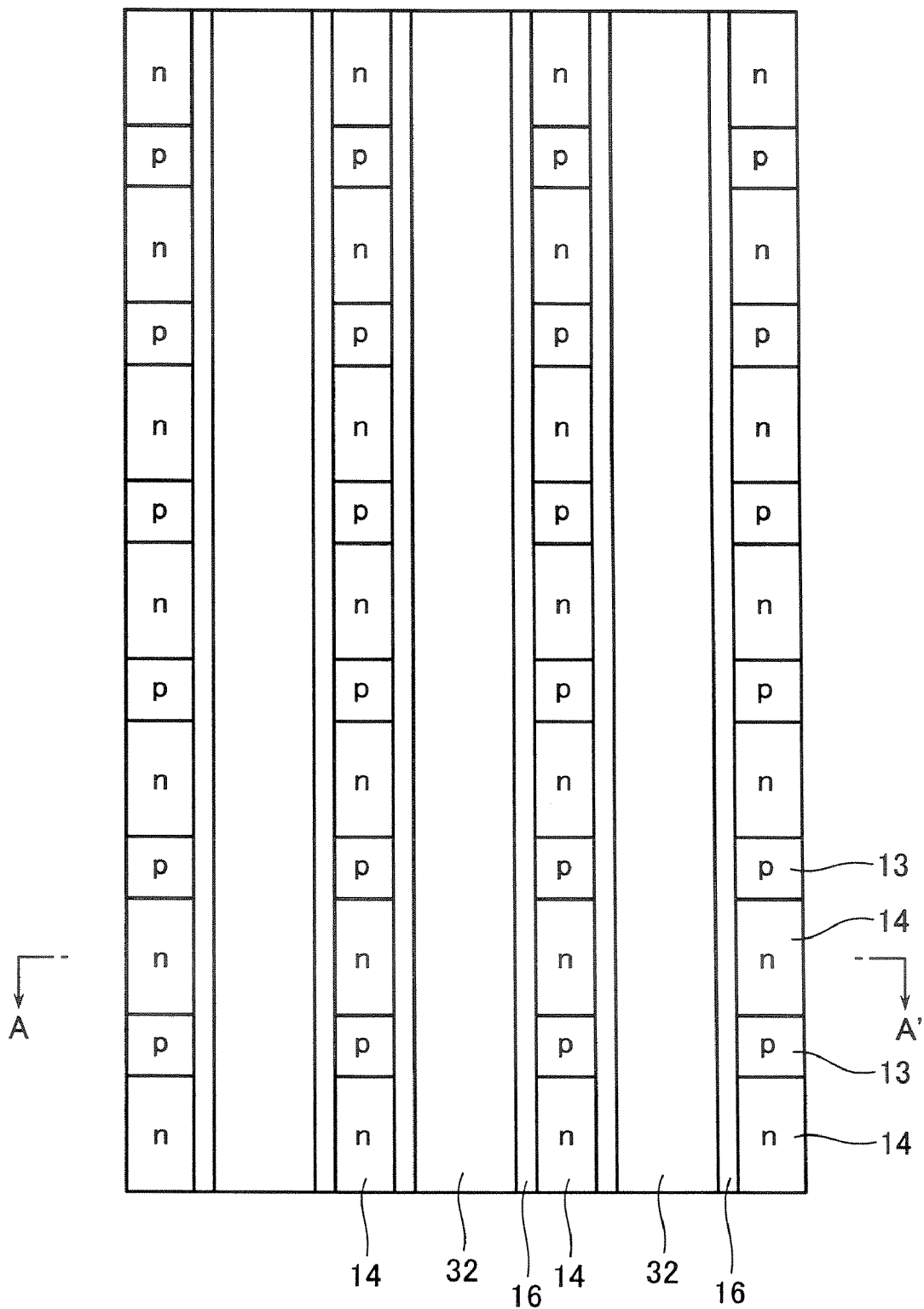
FIG. 1 is a plan view of a semiconductor device according to a first embodiment of the present invention.
Figure 2:
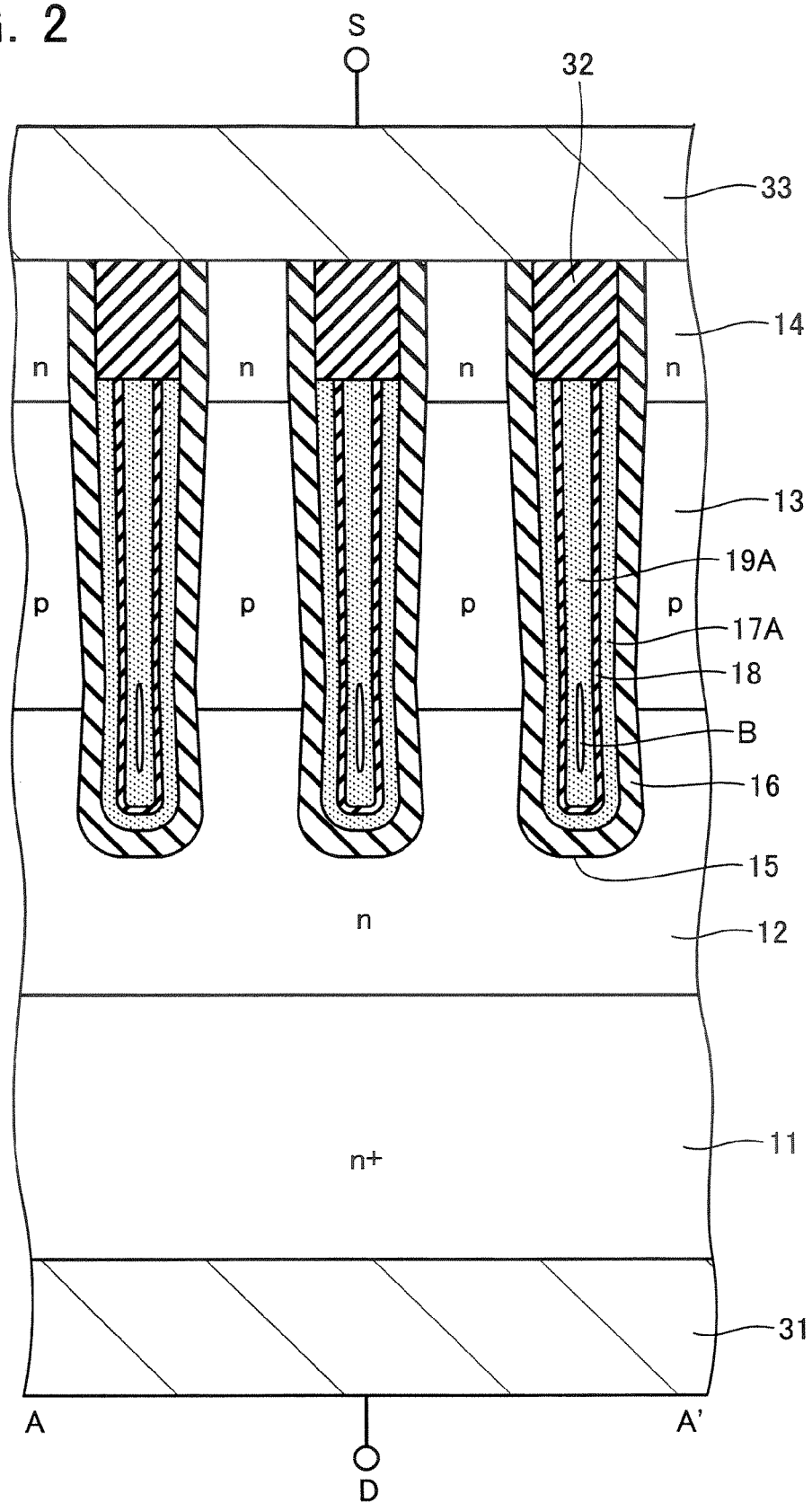
FIG. 2 is a cross-sectional view taken along A-A' of FIG. 1.

Semiconductor devices according to the embodiments of the present invention will now be described next in detail with reference to the drawings. FIG. 1 shows a plan view of a semiconductor device according to a first embodiment of the present invention, and FIG. 2 shows an A-A' cross-sectional view thereof. FIG. 1 shows a plan view in a state where a later-described source electrode 33 is removed. In the following embodiments, with the first and second conduction types exemplified as the n-type and p-type, an n-channel MOS transistor having a p-type base layer is shown.

As shown in FIG. 2, the n-channel MOS transistor comprises an $n^+$-type silicon substrate 11. The $n^+$-type silicon substrate 11 serves as a drain layer connected to a drain electrode 31 on the rear surface. Formed on the silicon substrate 11 is an n-type drift layer 12 having a lower impurity concentration and a higher resistance than those of the silicon substrate 11, and a p-type base layer 13 is formed thereon. An n+-type diffused source layer 14 is formed on a surface of the p-type base layer 13. A source electrode 33 is connected to both the source layer 14 and the p-type base layer 13.

Trenches 15 are formed from the surface of the n+-type source layer 14 through the p-type base layer 13 to a depth reaching the drift layer 12. The trenches 15 in this example are formed in stripes as shown in FIG. 1 (stripes extending in the direction perpendicular to the page of FIG. 2). The trenches 15 may be formed in mesh instead of stripes.

To relieve electric field concentration at an edge of the bottom, the trench 15 is reverse-tapered such that a width at a certain position on the bottom is made broader than a width at a higher portion. A first gate electrode 17A and a second gate electrode 19A are buried in the trench 15 via a gate insulator 16, and these two configure a gate electrode of the MOS transistor. An interlayer insulator film 32 is formed at an upper end of the trench 15 to electrically isolate the source electrode 33 from the gate electrode. The first gate electrode 17A and the second gate electrode 19A are formed of the same material such as a silicon-based conductor film, specifically polysilicon or a metal silicide (such as tungsten silicide), for example. The first gate electrode 17A is formed along the inner wall of the trench 15, leaving a recess inside. To fill the recess, the second gate electrode 19A is buried therein. An interlayer insulator film 18 is formed between the first gate electrode 17A and the second gate electrode 19A. The interlayer insulator film 18 may be formed through deposition of a silicon oxide film in the recess in the gate electrode 17A using a process of CVD or the like after formation of the gate electrode 17A. Alternatively, a silicon oxide film formed through natural oxidation of polysilicon after formation of the gate electrode 17A may be used as the interlayer insulator film 18. As the interlayer film, a conductive film such as a tungsten silicide film may be used instead of the interlayer insulator film 18. In a word, an available film may be of either a material different from or a material same as that used in the first gate electrode 17A and the second gate electrode 19A if the material is distinctive and can serve as an interlayer film.

Figure 3:
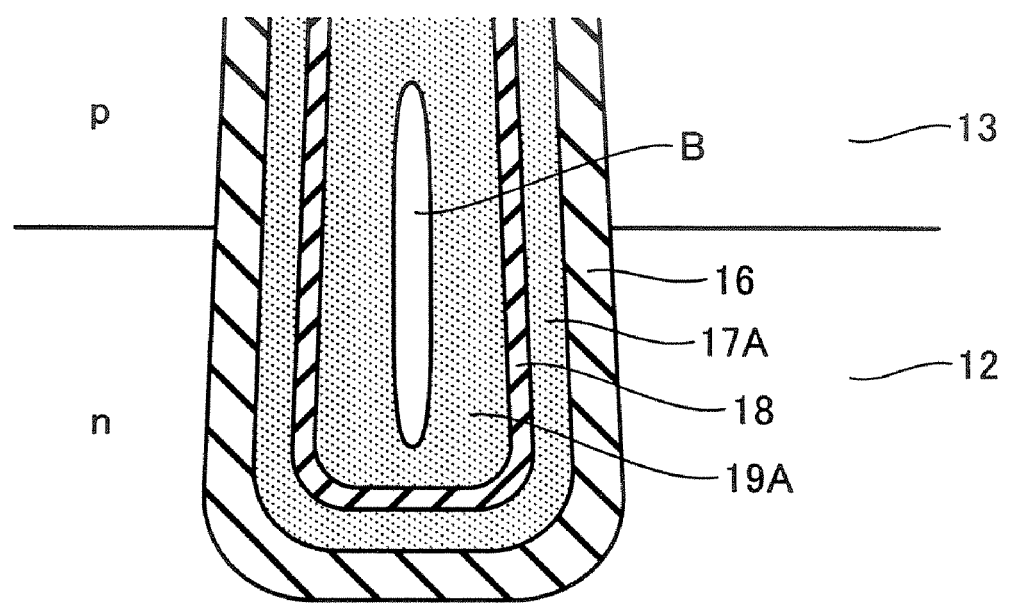
FIG. 3 is an enlarged view of the bottom of a trench 15 shown in FIG. 2.

The trench 15 is reverse-tapered as shown in FIG. 3, and a void B may arise near the bottom of the gate electrode 19 in many instances. The void B may be formed in the vicinity of the center of the trench 15 in many instances immediately after deposition of polysilicon for formation of the second gate electrode 19A. The void B causes no problem so long as it exists in the polysilicon film at the center. Rather, it reduces stresses due to fine patterning and contributes to prevention of occurrences of D-S leakage current. During crystallization of polysilicon proceeding in a heat treatment step executed after the formation of polysilicon, however, the void B may migrate toward the sidewall in the trench 15. In the semiconductor device of this embodiment, the gate electrode includes the first gate electrode 17A and the second gate electrode 19A, and the interlayer insulator film 18 formed between both. Therefore, even if the void B arises and migrates, the migration is halted at the position of the interlayer insulator film 18. Accordingly, the migration of the void B causes no deterioration of properties of the MOS transistor (such as an increase in on resistance and a reduction in breakdown voltage). If the void B can not migrate even after it arises, the void B can contribute to reduction in stress due to fine patterning and can contribute to prevention of occurrences of D-S leakage current.

Figure 4:
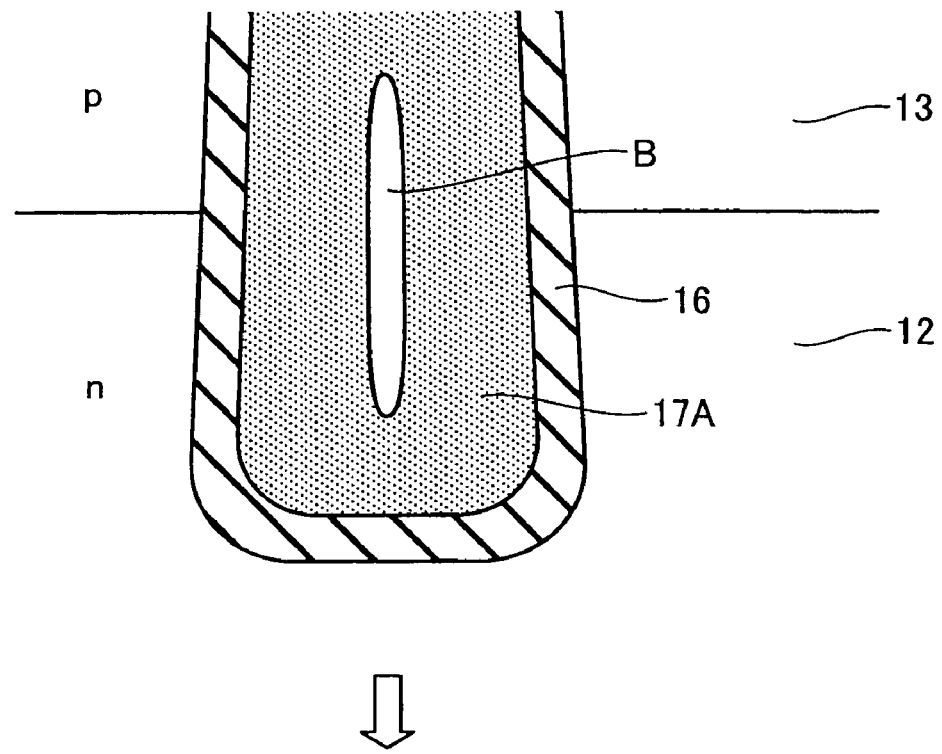
FIG. 4 shows prior art and a problem thereof.
Figure 4:
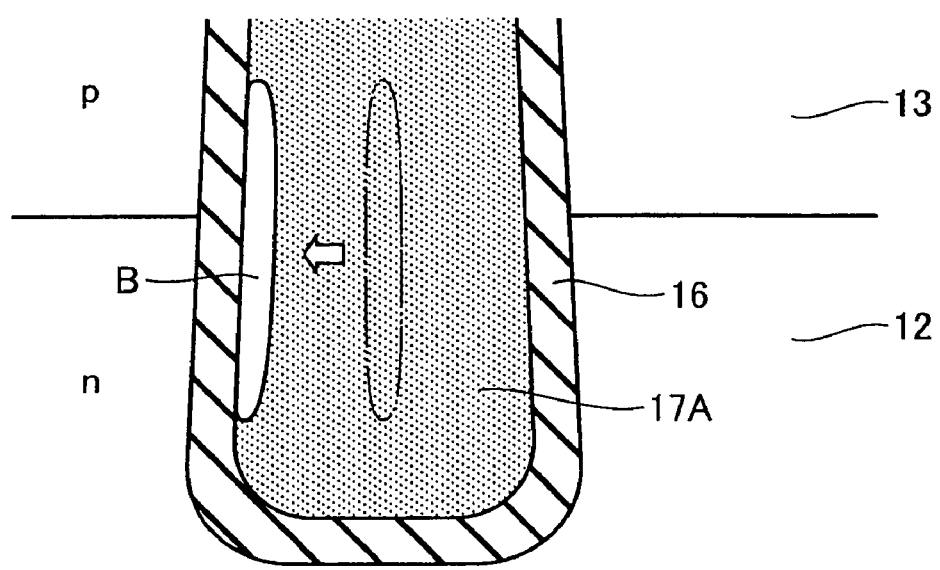

In a conventional trench-gate MOS transistor, the gate electrode is composed only of a single gate electrode as shown in FIG. 4. Even though a void B arises in such the structure, there is no problem if the void B locates near the center of a trench 15. If the void B migrates during a heat treatment step as shown on the lower side in FIG. 4 and comes in contact with a gate insulator 16, though, it may cause an increase in on resistance, a reduction in breakdown voltage, and a variation in threshold voltage possibly. With this regard, this embodiment does not cause such the situation because it is provided with the interlayer insulator film 18 between the gate electrodes 17A and 19A.

Figure 5:
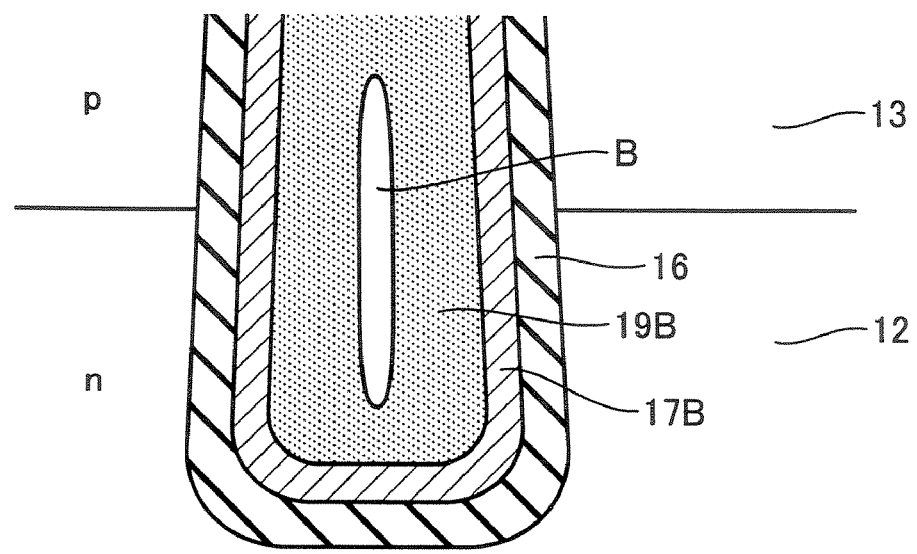
FIG. 5 shows a semiconductor device according to a second embodiment of the present invention.

FIG. 5 shows a MOS transistor according to a second embodiment of the present invention. This embodiment is same in plan view as the first embodiment (FIG. 1) and also same in cross-sectional view as a whole (FIG. 2) and is omitted from the following detailed description. As shown in FIG. 5, the gate electrode is different in structure from that in the first embodiment. In a word, the gate electrode in this embodiment is formed of two parts including a first gate electrode 17B and a second gate electrode 19B. The former is a film of metal such as tungsten (W), copper (Cu) and titanium (Ti) while the latter is formed of a silicon-based conductor film, for example, polysilicon or a metal silicide (such as tungsten silicide). Thus, both are different in material from each other. In this structure, if the trench 15 is reverse-tapered, a void B easily arises in the second gate electrode 19B as in the first embodiment, and the void B may migrate possibly during a heat treatment step. In this embodiment, however, the first gate electrode 17B is formed of a different material, for example, a film of metal such as tungsten, copper and titanium. Therefore, even if the void B arises and migrates, the migration of the void B halts at the interface between the gate electrodes 17B and 19B. Therefore, the void B is prevented from coming into contact with the gate insulator 16 to bring an event in which the properties of the MOS transistor deteriorate. If the void B can not migrate even after the void B arises, it can contribute to reduce stresses due to fine patterning and contributes to prevention of occurrences of D-S leakage current. The first gate electrode 17B formed of a metal film can make the gate resistance lower than that formed of only polysilicon. The example described in FIG. 5 includes no interlayer insulator (18) between the first gate electrode 17B and the second gate electrode 19B as in the first embodiment though such the interlayer insulator may be formed, needless to say.

Figure 6:
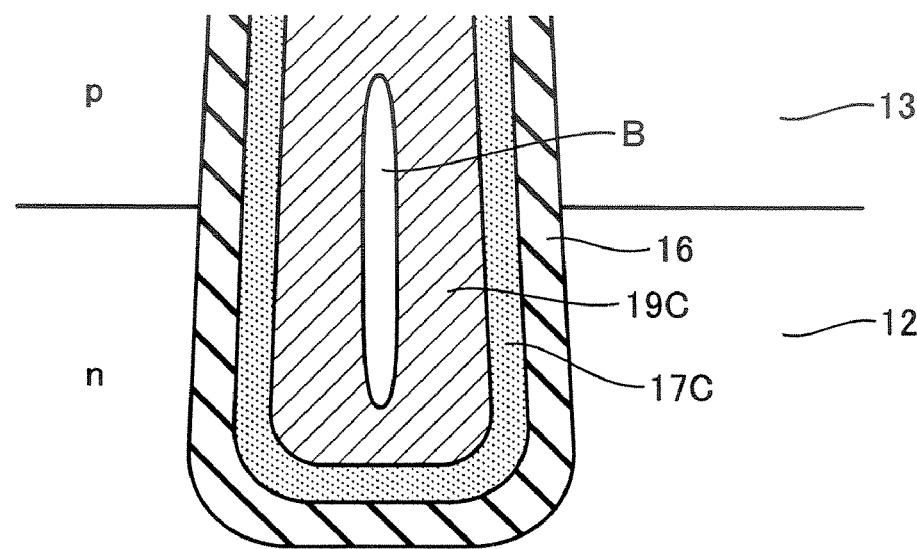
FIG. 6 shows a semiconductor device according to a third embodiment of the present invention.

FIG. 6 shows a MOS transistor according to a third embodiment of the present invention. In this embodiment the gate electrode is formed of two parts including a first gate electrode 17C and a second gate electrode 19C like the above embodiment. The former is formed of a silicon-based conductor film, for example, polysilicon or a metal silicide (such as tungsten silicide) while the latter is formed of a film of metal such as tungsten, copper and titanium in contrast to the second embodiment. Also in this case, the migration of the void B can halt at the interface between the gate electrodes 17C, 19C to exert the same effect as in the above embodiment. The second gate electrode 19C formed of a metal film can make the gate resistance lower than that formed of only polysilicon. The example described in FIG. 6 includes no interlayer insulator (18) between the first gate electrode 17C and the second gate electrode 19C as in the first embodiment though such the interlayer insulator may be formed, needless to say.

The embodiments of the invention have been described above though the present invention is not limited to these embodiments but rather may be given various variations and additions without departing from the scope of the invention. For example, in the embodiments, the MOS transistor is exemplified as the semiconductor device though the present invention is also applicable to an IGBT and a Schottky barrier diode. In the above embodiments the trench is described as reverse-tapered though the present invention is not limited to this shape and is also effective to trench-gates in all shapes and effectively operates when a void arises in such the trench-gates. For example, the present invention is also effective to a semiconductor device including a trench having a sidewall tapered at an angle of almost near 90°. The description of the above embodiment is given to the effect when the void arises specifically. The present invention is not limited to the semiconductor device in which the void arises. It is also effective to a semiconductor device in which no void arises actually, from the viewpoint of prevention of deterioration of the properties when a void arises.

Figure 7:
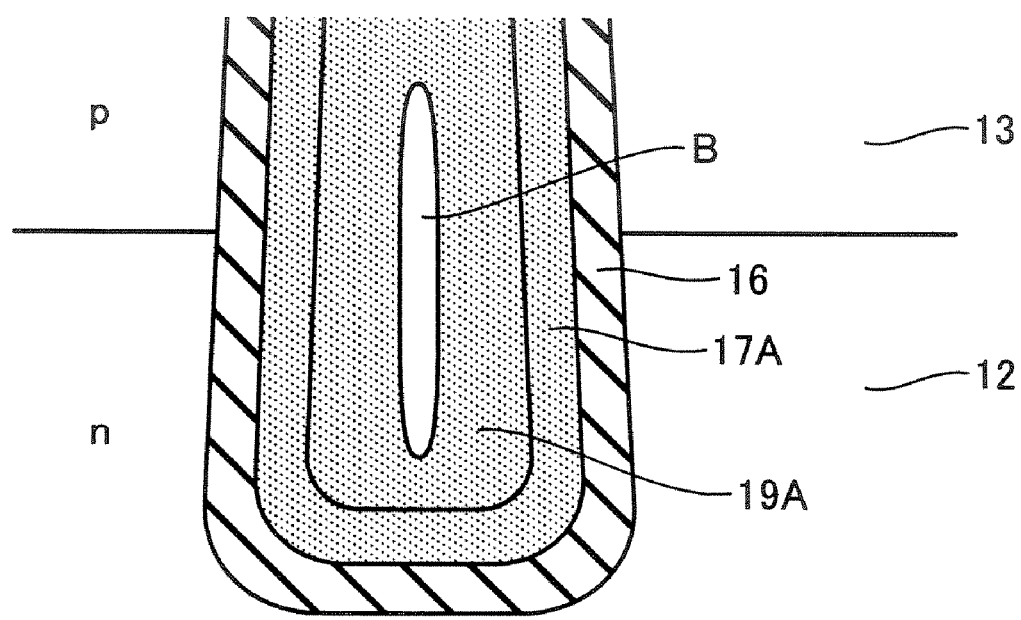
FIG. 7 shows a semiconductor device according to a variation of the embodiment of the present invention.

In the above first embodiment, the first gate electrode 17A and the second gate electrode 19A are made of the same material and the interlayer insulator film 18 is formed therebetween to halt the migration of the void. The interlayer film may be omitted as shown in FIG. 7 for the reason that the first gate electrode 17A and the second gate electrode 19A are different in crystal grain from each other, for example, and the migration of the void can halt at the interface between both.

What is claimed is:

1. A semiconductor device, comprising:
   a first semiconductor layer of a first conduction type;
   a second semiconductor layer of the first conduction type formed on a surface of said first semiconductor layer;
   a semiconductor base layer of a second conduction type formed on said second semiconductor layer;
   a semiconductor diffusion layer of the first conduction type formed on a surface of said semiconductor base layer;
   a trench formed from a surface of said semiconductor diffusion layer to a depth reaching said second semiconductor layer;
   a gate electrode formed of a conductor film buried in said trench with a gate insulator interposed therebetween;
   a first main electrode brought into contact with said semiconductor diffusion layer and said semiconductor base layer; and
   a second main electrode formed on a rear surface of said first semiconductor layer,
   wherein said conductor film includes a first conductor film formed along an inner wall of said trench covering the trench at its bottom and side to have a recess inside said trench, the recess formed to reach the second semiconductor layer, and a second conductor film formed to fill said recess,
   said first and second conductor films being composed of the same material but being different in crystal grain.

2. The semiconductor device according to claim 1, wherein one of said first conductor film and said second conductor film is formed of a silicon-based conductor film.

3. The semiconductor device according to claim 1, wherein one of said first conductor film and said second conductor film is formed of polysilicon.

4. The semiconductor device according to claim 1, wherein one of said first conductor film and said second conductor film is formed of a metal silicide.

5. The semiconductor device according to claim 1, wherein said second conductor film contains a void therein.

6. A semiconductor device comprising:
   a first semiconductor layer of a first conduction type;
   a second semiconductor layer of the first conduction type formed on a surface of said first semiconductor layer;
   a semiconductor base layer of a second conduction type formed on said second semiconductor layer;
   a semiconductor diffusion layer of the first conduction type formed on a surface of said semiconductor base layer;
   a trench formed from a surface of said semiconductor diffusion layer to a depth reaching said second semiconductor layer;
   a gate electrode formed of a conductor film buried in said trench with a gate insulator interposed therebetween;
   a first main electrode brought into contact with said semiconductor diffusion layer and said semiconductor base layer; and
   a second main electrode formed on a rear surface of said first semiconductor layer,
   wherein said conductor film includes a first conductor film formed along an inner wall of said trench covering its bottom and side to have a recess inside said trench, the recess formed to reach the second semiconductor layer, and a second conductor film formed to fill said recess, with an interlayer film formed between said first conductor film and said second conductor film and along the surface of said recess in said first conductor film,
   wherein the first and second semiconductor films are electrically connected to each other.

7. The semiconductor device according to claim 6, wherein said interlayer film is a silicon oxide film.

8. The semiconductor device according to claim 6, wherein said first conductor film is a silicon-based conductor film, wherein said interlayer film is a silicon oxide film formed through natural oxidation of said first conductor film.

9. A semiconductor device comprising:
   a first semiconductor layer of a first conduction type;
   a second semiconductor layer of the first conduction type formed on a surface of said first semiconductor layer;
   a semiconductor base layer of a second conduction type formed on said second semiconductor layer;
   a semiconductor diffusion layer of the first conduction type formed on a surface of said semiconductor base layer;
   a trench formed from a surface of said semiconductor diffusion layer to a depth reaching said second semiconductor layer;
   a gate electrode formed of a conductor film buried in said trench with a gate insulator interposed therebetween;
   a first main electrode brought into contact with said semiconductor diffusion layer and said semiconductor base layer; and
   a second main electrode formed on a rear surface of said first semiconductor layer,
   wherein said conductor film includes a first conductor film formed along an inner wall of said trench covering the trench and its bottom and side to have a recess inside said trench, the recess formed to reach the second semiconductor layer, and a second conductor film formed to fill said recess,
   wherein the first and second conductor films are electrically connected to one another, and
   wherein one of said first conductor film and said second conductor film is a silicon-based conductor film, and the other one of said first conductor film and said second conductor film is a metal film.

10. The semiconductor device according to claim 9, further comprising an interlayer film formed between said first conductor film and said second conductor film and along the surface of said recess in said first conductor film.

11. The semiconductor device according to claim 6, wherein said second conductor film contains a void therein.

12. The semiconductor device according to claim 9, wherein said second conductor film contains a void therein.

* * * * *